May 27, 1969 R. W. McMILLAN 3,447,095

SINGLE-SWITCH GAIN CHANGER

Filed Dec. 23, 1966

INVENTOR.
ROBERT W. Mc MILLAN
BY Julian C. Renfro
ATTORNEY

United States Patent Office 3,447,095

Patented May 27, 1969

3,447,095

SINGLE-SWITCH GAIN CHANGER

Robert W. McMillan, Orlando, Fla., assignor to Martin-Marietta Corporation, New York, N.Y., a corporation of Maryland Filed Dec. 23, 1966, Ser. No. 604,269

Int. Cl. H03f *1/30*

U.S. Cl. 330—144 9 Claims

ABSTRACT OF THE DISCLOSURE

This invention involves a circuit for varying the gain of a differential amplifier using a single electronic switch. The gain is varied by changing the impedance of the input circuit by intermittently switching an impedance between the differential inputs of the amplifier.

BACKGROUND OF THE INVENTION

The invention herein described was made in the course of or under a contract or subcontract thereunder with the Department of Defense.

*Field of the invention*

The present invention relates to a gain changing circuit for an amplifier and more particularly to a circuit for varying the gain of a differential amplifier by using only one switch.

The present circuit provides a single-switch gain changer circuit for an operational differential amplifier having two inputs and a feedback circuit coupling the amplifier output to the amplifier input. The input and feedback circuits each have impedances therein which determine the gain of the amplifier. In accordance with this invention the input circuit impedance is altered by a shunting circuit between the inputs to the amplifier which shunting circuit contains an impedance therein and may be switched into and out of the circuit by a switching circuit controlled by a remote voltage signal. The input impedance is thus varied changing the gain of the amplifier.

*Description of the prior art*

An operational amplifier has a gain dependent upon the ratio of the impedance of the degenerative feedback to the impedance of the input circuit. The gain may be varied by varying either the impedance in the feedback circuit or the impedance of the input circuit.

In the past, gain changers for differential operational amplifiers have been used in which two switches were used, each switch being used to connect each side of the amplifier to ground through a resistance thereby changing the impedance of the circuit and thereby the gain. The second switch is required to keep the amplifier differential inputs balanced to prevent excessive offset.

BRIEF DESCRIPTION OF THE DRAWINGS

Other objects, features, and advantages of this invention will be apparent from a study of the written description and the drawings in which.

DESCRIPTION OF THE PREFERRED EMBODIMENTS

Figure 1:
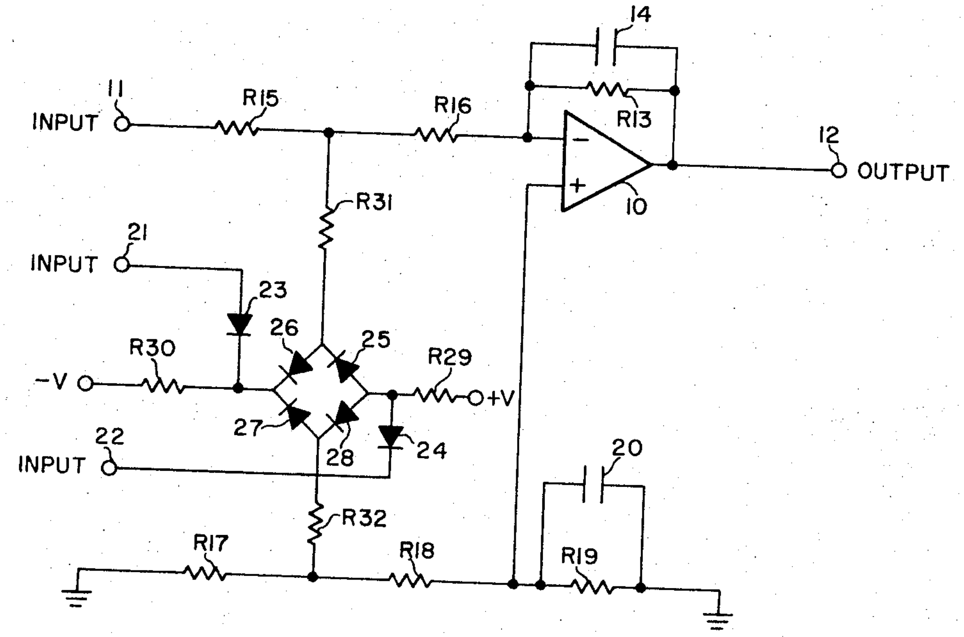
FIGURE 1 is a schematic diagram of a preferred embodiment of the present invention.

FIGURE 1 shows a first embodiment of the present invention in which an operational amplifier 10 has an input 11 and an output 12. The amplifier 10 has a feedback circuit with an impedance therein including a resistance $R_{13}$ and a capacitance 14. The capacitor 14 acts as a filter in this circuit but as can be seen other impedance combinations may be used to suit the needs of the circuit design. A signal applied to input 11 feeds through resistors $R_{15}$ and $R_{16}$ to amplifier 10. For simplicity in balancing the circuit on the common side of the amplifier, a resistor $R_{17}$ of the same value as resistor $R_{15}$ and a resistor $R_{18}$ of the same value as resistor $R_{16}$ is added to the circuit, as is resistor $R_{19}$ and capacitor 20 which may be the same value as resistor $R_{13}$ and capacitor 14, respectively.

Amplifier 10 has a gain proportional to the ratio of the feedback impedance to the input impedances:

$$e_{12}=e_{11}\frac{Z\text{ feedback}}{Z\text{ input}} \tag{1}$$

where $e_{12}$ is the output voltage, $e_{11}$ is the input voltage, Z input is the input impedance and Z feedback is the feedback impedance. Substituting the resistances of the circuit of FIGURE 1 but ignoring the filter capacitor 14 the gain would be:

$$e_{12}=e_{11}\frac{R_{13}}{R_{15}+R_{16}} \tag{2}$$

To vary the gain of amplifier 10, either the feedback or the input impedances may be varied and this may be done by switching into the circuit additional impedances. This might be accomplished by a connection to ground from the input circuit through a resistance and a switch. When the switch is closed the input impedance is altered. This however also requires a similar circuit in the common input circuit to the amplifier to balance the circuit. Thus two switches would be required. The present circuit accomplishes a change in the gain of an amplifier by the use of a single switch coupled between the input circuit and the common side of the amplifier.

Switching input signals are applied to the control signal input terminals 21 and 22 which input signals are of the same magnitude except 180° out-of-phase with each other. Signals 180° out-of-phase may be obtained by any of several known means but I prefer to use a bistable multivibrator. A bistable multivibrator has two stable states and may be switched from one stable state to a second stable state by the input signals. In using a bistable multivibrator, it is necessary only to have input 21 connected to the output of one stable state and the input 22 connected to the output of the second stable state. The out-of-phase inputs at input terminals 21 and 22 are applied respectively to diodes 23 and 24. Diode 24 acts as a gate in that +V places a charge on the anodes of switching diodes 25, 26, 27 and 28 only when a voltage signal appears at the cathode of diode 24. Similarly a −V voltage places a voltage on the cathodes of the switching diodes 25, 26, 27 and 28 only when a voltage signal is placed upon the anode of diode 23. These voltages placed upon the switching diodes 25, 26, 27 and 28 reduce the resistance in the diodes and shunt part of the input signal received at input 11 to the common side of the amplifier where it effectively cancels an equal portion of the input on the negative side. Resistors $R_{29}$ and $R_{30}$ are source isolation resistors and resistors $R_{31}$ and $R_{32}$ are the resistors used to change the impedance of the input circuit. Resistors $R_{29}$ and $R_{30}$ are very large compared to the forward resistance of the diodes 25, 26, 27 and 28 but the back resistance of the diodes is extremely large when compared with resistors $R_{29}$ and $R_{30}$. Thus it can be seen that an electronic switch has been provided whereby a positive voltage potential applied to input terminal and a negative voltage potential applied to input terminal 21 will render the switch operative or closed, allowing any current to flow through resistor $R_{31}$, the diode bridge circuit and resistor $R_{32}$. When there is a negative voltage potential applied to input terminal 22 and a positive voltage potential applied to input terminal 21, the diode bridge circuit will remain inoperative or open by the back resistance of the diodes 25, 26, 27 and 28 and no current will flow.

The gain of the circuit with the switch open is:

$$\frac{e_{12}}{e_{11}}=\frac{R_{13}}{R_{15}+R_{16}} \tag{3}$$

as already described. With the switch closed, the gain is found to be:

$$\frac{e_{12}}{e_{11}}=\frac{R_{13}/(R_{15}+R_{16}}{1+2R_{15}R_{16}/(R_{31}+R_{32})(R_{15}+R_{16})} \tag{4}$$

If M denotes the fraction of the total time that the switch is open, then the gain as a function of M is equal to:

$$\frac{e_{12}}{e_{11}}=\frac{MR_{13}}{R_{15}+R_{16}}+\frac{(1-M)R_{13}/R_{15}+R_{16})}{1+2R_{15}R_{16}/(R_{31}+R_{32})(R_{15}+R_{16})} \tag{5}$$

This arrangement allows gain to be varied continuously as a function of variable M. The circuit lowers the gain by shunting part of the input signal to the positive side of the amplifier where it effectively cancels the input on the negative side because of the differential nature of the input. This cancellation of part of the input causes a gain reduction.

At this point it can be see that a circuit has been provided whereby the gain of an amplifier can be varied by the use of a single switching circuit and that the gain can be continuously varied by a control input signal. In actual practice, however, it is necessary to make a correction for the bias network of the diode switches. While applicant does not wish to be limited to any particular circuit values for the embodiment of the invention described in connection with FIGURE 1, the following set of representative values have been found to be suitable in this circuit:

| | | |
|---|---|---|
| Resistors $R_{15}$, $R_{16}$, $R_{17}$, $R_{18}$ | ohms | 4.22K |
| Resistors $R_{13}$, $R_{19}$ | do | 64.9K |
| Resistors $R_{31}$, $R_{32}$ | do | 211 |
| Resistors $R_{20}$, $R_{30}$ | do | 4.22K |
| Capacitors **14**, **20** | mf | .032 |
| Diodes **23**, **24** | | 1N916 |
| Diodes **25**, **26**, **27**, **28** | | 1N916 |
| +V (volts DC) | | +12 |
| −V (volts DC) | | −12 |

Figure 2:
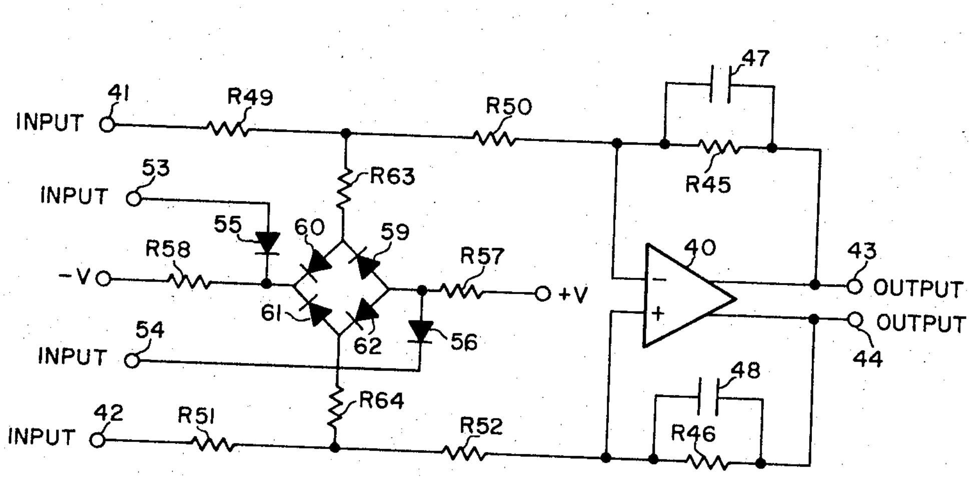
FIGURE 2 is a schematic diagram of a second embodiment of the present invention.

Referring now to FIGURE 2, a second embodiment of the present invention has a pure differential amplifier 40 with input terminals 41 and 42 and output terminals 43 and 44 and feedback impedances including resistor $R_{45}$, and capacitor 47 on one side of the circuit and resistor 46 and capacitor 48 on the other. The input impedance circuits have resistors $R_{49}$, $R_{50}$ on one side, and $R_{51}$, $R_{52}$ on the other when the switching circuit is open and resistors $R_{49}$, $R_{50}$, $R_{63}$ and $R_{51}$, $R_{52}$, $R_{64}$ when the switch is closed.

The gain with the switch open is equal to:

$$\frac{\text{Output}_{43}-\text{output}_{44}}{\text{Input}_{42}-\text{input}_{41}}=\frac{R_{45}}{R_{49}+R_{50}}=\frac{R_{46}}{R_{51}+R_{52}} \tag{7}$$

and with the switch closed the gain would be equal to:

$$\frac{\text{Output}_{43}-\text{output}_{44}}{\text{Input}_{42}-\text{input}}=\frac{R_{45}/(R_{49}+R_{50})}{1+2R_{49}R_{50}/(R_{63}+R_{64})(R_{49}+R_{50})} \tag{8}$$

where resistor $R_{49}$ is equal to resistor $R_{51}$, resistor $R_{50}$ is equal to $R_{52}$ and resistor $R_{46}$ is equal to $R_{45}$.

The switching circuit is the same as that already described and has a diode bridge circuit with diodes 59, 60, 61 and 62 and source isolation resistors $R_{57}$ and $R_{58}$. A negative voltage input at control input terminal 53 and a positive input at control input terminal 54, increases the resistance through diodes 55 and 56, respectively, and places a negative voltage on the cathode and a positive voltage on the anodes of diodes 59, 60, 61 and

62. The switching circuit is thus operative or closed and a signal can flow through the diode bridge circuit. While this switching circuit has been found to operate satisfactorily, other switching circuits including integrated choppers and various types of relays might also be used.

The following representative circuit values have been found to operate satisfactorily but it is not intended that this invention be limited by any particular circuit values and the following are given for illustrative purposes only:

| | | |
|---|---|---|
| Resistors $R_{49}$, $R_{50}$, $R_{51}$ and $R_{52}$ | ohms | 4.22K |
| Resistors $R_{45}$ and $R_{46}$ | do | 64.9K |
| Resistors $R_{63}$ and $R_{64}$ | do | 211 |
| Resistors $R_{57}$ and $R_{58}$ | do | 4.22K |
| Capacitors **46** and **47** | mf | .032 |
| Diodes **55**, **57**, **59**, **60**, **61** and **62** | | 1N916 |
| −V (volts DC) | | −12 |
| +V (volts DC) | | +12 |

From the foregoing description it will be clear that a circuit has been provided for varying the gain of an operational differential amplifer using a single switching circuit. The circuit as described has a wide range of application some of which have been described. It is to be understood that other variations are contemplated as being within the spirit of the invention.

This invention is not to be constructed as limited to the particular forms disclosed herein, since these are to be regarded as illustrative rather than restrictive.

I claim:

1. A single-switch gain changer circuit for an amplifier comprising:

(a) an amplifier circuit;
(b) two input circuits coupled to said amplifier circuit;
(c) at least one output circuit coupled to said amplifier circuit;
(d) at least one feedback circuit coupling each said output circuit to at least one said input circuit;
(e) impedance changing and matching means for connecting one said input circuit through an impedance to the other said input circuit;
(f) said impedance changing means including a switching means therein adapted to complete the continuity through said impedance changing means;
(g) whereby the gain of said amplifier may be varied by said switching means completing the continuity through said impedance changing and matching means.

2. The circuit in accordance with claim 1 in which said switching means is made operative by an electrical control signal.

3. The circuit in accordance with claim 2 in which the impedance in said impedance means is a resistance.

4. The circuit in accordance with claim 3 in which said input circuits have an impedance therein.

5. The circuit in accordance with claim 4 in which said feedback circuit has an impedance therein.

6. The circuit in accordance with claim 5 in which said switching means includes a diode bridge circuit.

7. A gain changing circuit for an amplifier circuit comprising in combination:

(a) an amplifier circuit;
(b) two input circuits, each said input circuit having an impedance therein;
(c) two output circuits coupled to said amplifier circuit;
(d) two feedback circuits each connected from one said output circuit to one said input circuit;
(e) a resistance circuit connected between said two input circuits;
(f) said resistance circuit having an electronic switching circuit therein for providing continuity through said resistance circuit only upon said switching circuit receiving an electronic signal whereby the gain of said amplifier circuit is dependent upon the opening and closing of said switching circuit.

8. The circuit according to claim 7 in which said electronic switching circuit includes a diode bridge circuit.

9. The circuit according to claim 7 in which the impedance in each said input circuit is a resistance.

References Cited

UNITED STATES PATENTS

| | | | |
|---|---|---|---|
| 3,141,136 | 7/1964 | Pagano | 307—229 X |
| 3,294,961 | 12/1966 | Hose | 306—229 X |

OTHER REFERENCES

Handbook of Operational Amplifier Applications, Burr-Brown Research Corp., Tucson, Ariz., first edition, 1963, page 19.

JOHN KOMINSKI, *Primary Examiner.*

J. B. MULLINS, *Assistant Examiner.*

U.S. Cl. X.R.

328—168; 330—69